United States Patent
Franco et al.

(10) Patent No.: US 7,380,224 B2
(45) Date of Patent: May 27, 2008

(54) METHOD AND SYSTEM FOR NON-LINEAR STATE BASED SATISFIABILITY

(75) Inventors: John V. Franco, Cincinnati, OH (US); W. Mark VanFleet, Glen Burnie, MD (US); John Schlipf, Cincinnati, OH (US); Michael R. Dransfield, Ellicott City, MD (US)

(73) Assignees: The United States of America as represented by the National Security Agency, Washington, DC (US); The University of Cincinnati, Cincinnati, OH (US)

( * ) Notice: Subject to any disclaimer, the term of this patent is extended or adjusted under 35 U.S.C. 154(b) by 385 days.

(21) Appl. No.: 11/090,647

(22) Filed: Mar. 25, 2005

(65) Prior Publication Data

US 2005/0171747 A1    Aug. 4, 2005

Related U.S. Application Data

(63) Continuation of application No. 10/164,203, filed on Jun. 6, 2002, now Pat. No. 6,912,700.

(60) Provisional application No. 60/296,380, filed on Jun. 6, 2001.

(51) Int. Cl.
   *G06F 17/50* (2006.01)
(52) U.S. Cl. .................. 716/4; 716/1; 716/17
(58) Field of Classification Search .................. 716/1, 716/2, 4, 17
   See application file for complete search history.

(56) References Cited

U.S. PATENT DOCUMENTS 5,088,048 A * 2/1992 Dixon et al. .................. 706/51

OTHER PUBLICATIONS

Chatalic, Philippe, et al., *Multi-Resolution on Compressed Sets of Clauses*.
Baher, R. Iris, et al., *Power Optimization of Technology-Dependent Circuits Based on Symbolic Computation of Logic Implications*.
Paruthi, Viresh, et al., *Equivalence Checking Combining a Structural SAT-Solver, BDDs, and Simulation* (pp. 459-464).
Wilson, Chris, et al., *Reliable Verification Using Symbolic Simulation with Scalar Values*.
Kalla, Priyank, et al., *A BDD-Based Satisfiability Infrastructure Using the Unate Recursive Paradigm*, Technical Report: TR-CSE-99-6.
Gupta, Aarti, et al., *Fast Error Diagnosis for Combinational Verification*.
Prasad, Mukul R., et al., *Why is ATPG easy?*.
Bryant, Randal E., et al., *Microprocessor Verification Using Efficient Decision Procedures for a Logic of Equality with Uninterpreted Functions*.

(Continued)

*Primary Examiner*—Thuan Do
(74) *Attorney, Agent, or Firm*—Frost Brown Todd LLC; Stephen Albainy-Jenei; William S. Morriss

(57) ABSTRACT

A computerized method and system for solving non-linear Boolean equations is disclosed comprising at least partially solving a Boolean function; developing at least one inference regarding said Boolean function and saving said inference to a state machine; and accessing said inference from said state machine to develop at least one heuristic for determining whether said Boolean function is satisfiable.

8 Claims, 9 Drawing Sheets

Block diagram showing the progression of a given formula from input through processing to brancher.

OTHER PUBLICATIONS

Biere, Armin, et al., *Symbolic Model Checking without BDDs*; Submitted for TACAS (1999).

Tragoudas, S. et al., *Functional ATPG for Delay Faults*.

Nam, Gi-Joon, et al., *Satisfiability-Based Layout Revisited: Detailed Routing of Complex FPGAs Via Search-Based Boolean SAT* (pp. 167-175).

Bollig, et al., *Hierarchy Theorems for kOBDDs and kIBDDs*.

Wood, R. Glenn, et al., *FPGA Routing and Routability of Estimation Via Boolean Satisfiability*.

Gupta, Aarti, et al., *Integrating a Boolean Satisfiability Checker and BDDs for Combinational Equivalence Checking* (pp. 222 225).

Cyrluk, David et al., *An Efficient Decision Procedure for the Theory of Fixed-Sized Bit-Vectors*.

Takagi, Kazuyoshi, et al, *Computational Power of Nondeterministic Ordered Binary Decision Diagrams and Their Subclasses*, IEICE Trans. Fundamentals E80:4, pp. 663-669 (Apr. 1997).

Kawakubo, Kasuo, et al., *Formal Verification of Self-Testing Properties of Combinational Circuits*, Proceedings of ATS '96, pp. 119 122.

Puri, Ruchir, et al., *A BDD SAT solver for satisfiability testing: An industrial case study*, Annals of Mathematics and Artificial Intelligence 17, pp. 315-337 (1996).

Groote, Jan F, *Hiding Propositional Constants in BDDs*.

Nakaoka, Toshihiro, et al., *A Verification Algorithm for Logic Circuits with Internal Variables*, pp. 1920-1923.

Ashar, Pranav, et al., *Boolean Satisfiability and Equivalence Checking Using General Binary Decision Diagrams* (pp. 259 264.

Burch, J.R., et al., *Symbolic Model Checking: $10^{20}$ States and Beyond*, pp. 1-33.

Bryant, Randal E., et al., *Processor Verification Using Efficient Reductions of the Logic of Uninterpreted Functions to Propositional Logic* (May 1999).

Biere, A., et al., *Symbolic Model Checking using SAT procedures instead of BDDs*.

* cited by examiner

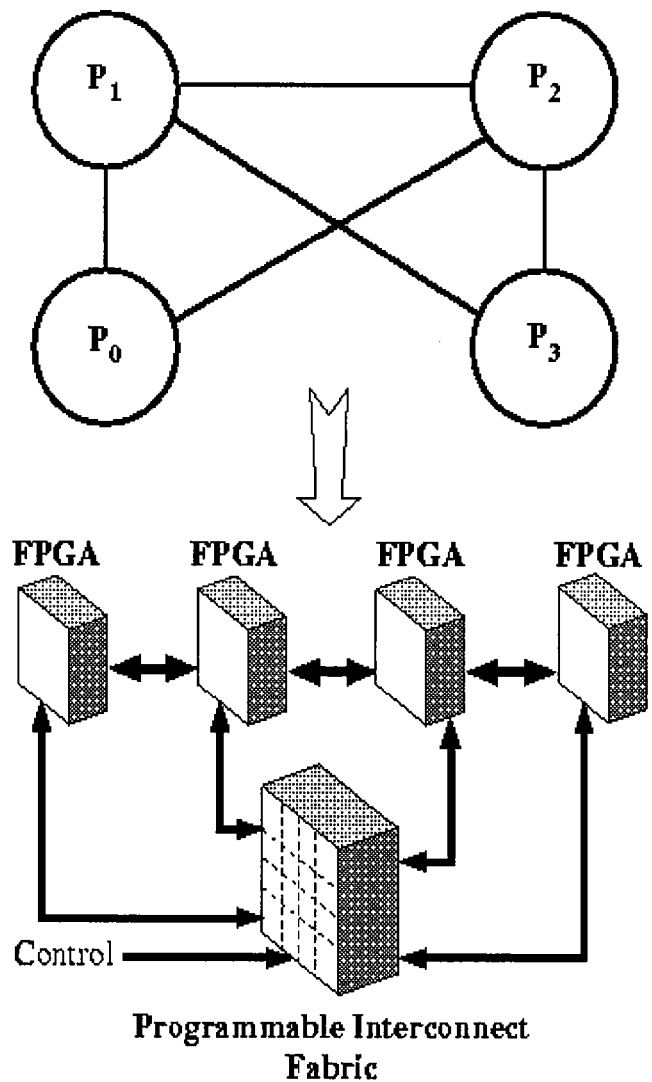

Figure 1: Example of an interconnect synthesis problem. A conceptual circuit is partitioned into sections $P_0 - P_3$ (at top of figure) and FPGAs and a specific interconnect fabric (at bottom of figure) are used to implement it. The problem is to determine whether the mapping from $P_i$ to $P_j$, $0 \leq i \leq 3$, $0 \leq j \leq 3$, $i \neq j$, given by the conceptual representation can be realized for some bollean control vector, and if so, to find that vector and show it is unique for the given interconnect representation, otherwise to show no such control vector is possible.

Module Specification
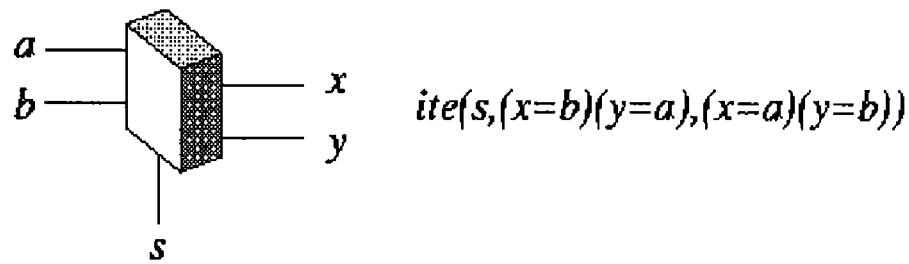
Interconnect Network
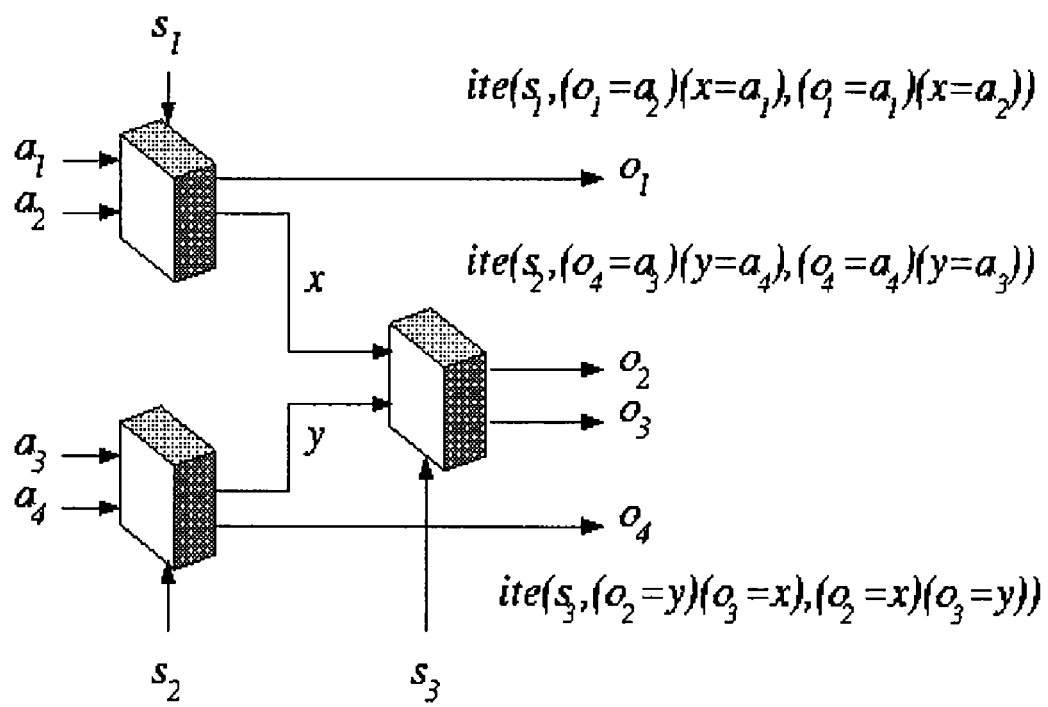
Figure 2: Sample Modules and Interconnect Fabric // These terms describe the switching of the three modules
$ite(s_1, (o_1 = a_2) \wedge (x = a_1), (o_1 = a_1) \wedge (x = a_2))$
$ite(s_2, (o_4 = a_3) \wedge (y = a_4), (o_4 = a_4) \wedge (y = a_3))$
$ite(s_3, (o_3 = x) \wedge (o_2 = y), (o_3 = y) \wedge (o_2 = x))$ // These terms insure uniqueness in individual switch modules
$(o_1 = a_1) \equiv (x = a_2)$
$(o_1 = a_1) \equiv \neg(o_1 = a_2)$
$(o_1 = a_1) \equiv \neg(x = a_1)$
$(o_4 = a_4) \equiv (y = a_3)$
$(o_4 = a_4) \equiv \neg(o_4 = a_3)$
$(o_4 = a_4) \equiv \neg(y = a_4)$
$(o_2 = x) \equiv (o_3 = y)$
$(o_2 = x) \equiv \neg(o_2 = y)$
$(o_2 = x) \equiv \neg(o_3 = x)$ // These terms express transitivity
$(x = a_1) \wedge (o_2 = x) \equiv (o_2 = a_1)$
$(x = a_1) \wedge (o_3 = x) \equiv (o_3 = a_1)$
$(x = a_2) \wedge (o_2 = x) \equiv (o_2 = a_2)$
$(x = a_2) \wedge (o_3 = x) \equiv (o_3 = a_2)$
$(y = a_3) \wedge (o_2 = y) \equiv (o_2 = a_3)$
$(y = a_3) \wedge (o_3 = y) \equiv (o_3 = a_3)$
$(y = a_4) \wedge (o_2 = y) \equiv (o_2 = a_4)$
$(y = a_4) \wedge (o_3 = y) \equiv (o_3 = a_4)$ // These terms express the desired mapping from input to output
$(o_1 = a_1) \wedge (o_1 = a_2) \wedge \ldots \wedge (o_2 = a_1) \wedge \ldots \wedge (o_4 = a_1) \wedge \ldots \wedge (o_4 = a_4)$ Figure 3: LBF for the example of Figure 2

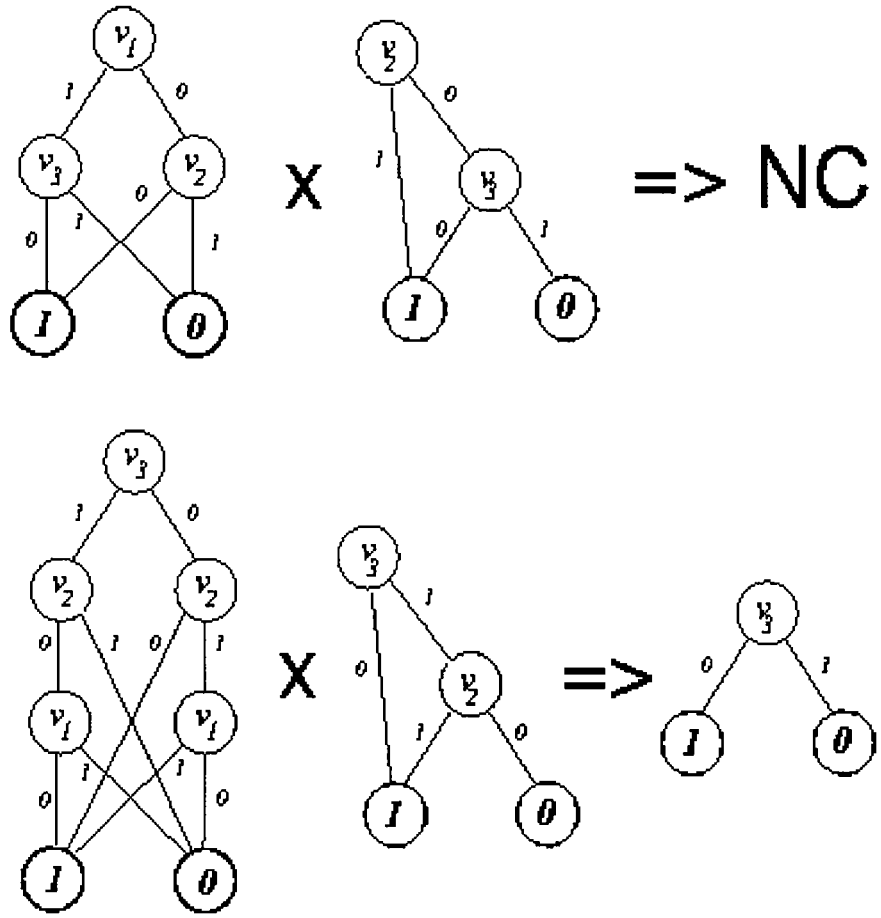
Figure 4: Effect of variable ordering on branch pruning. The top illustration shows no change (NC) but for the same functions with a different variable ordering branch pruning reveals $v_3$ must be false.

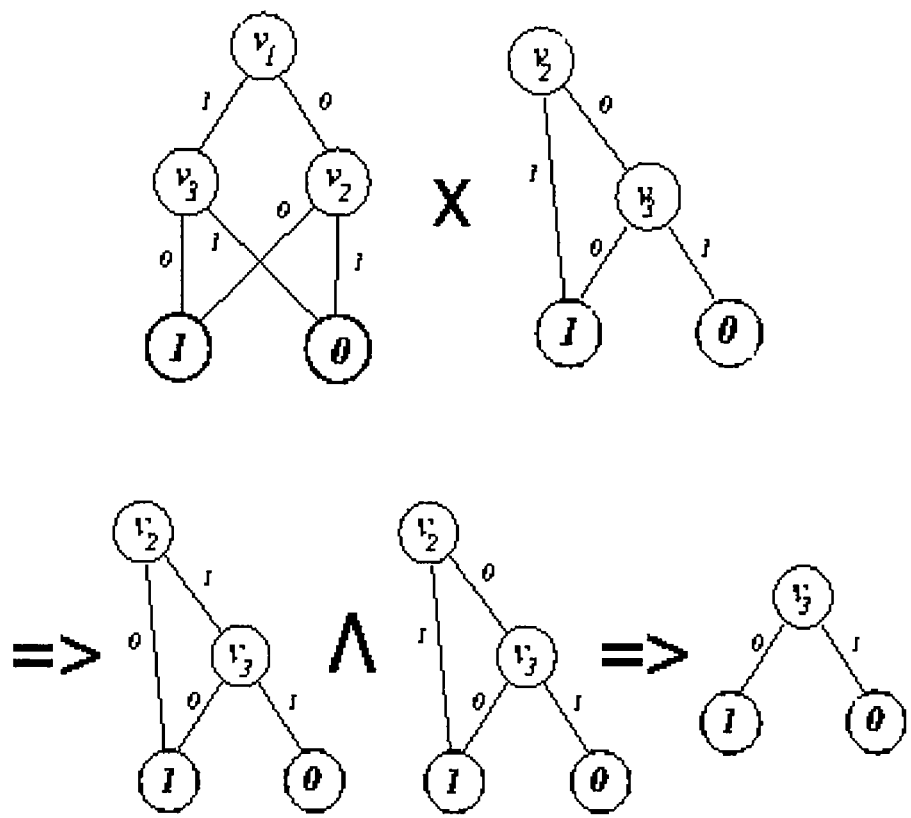
Figure 5: Result of strengthening on the same two functions. Variable $v_1$ is existentially quantified away and the conjunction of the two resulting functions reveals the inference.

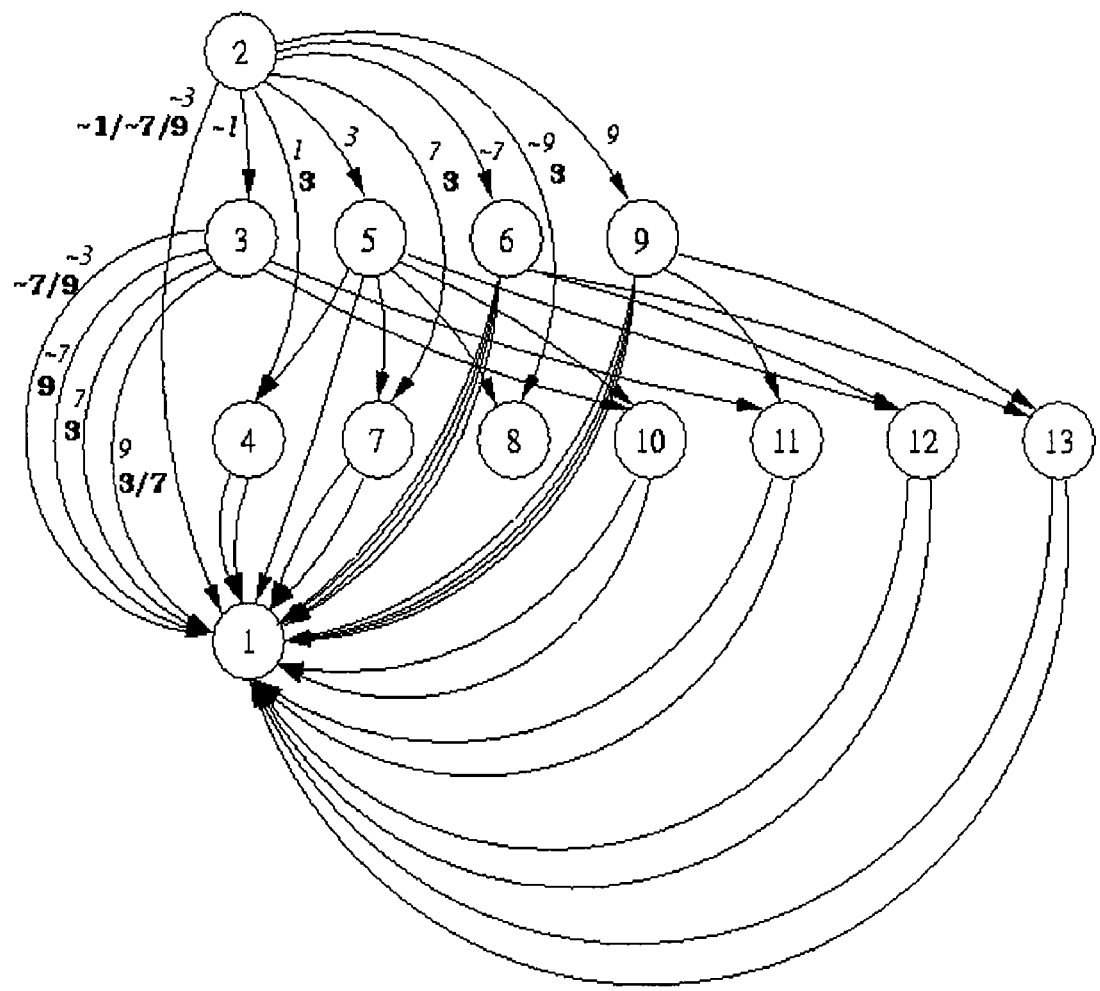
Figure 6: The states of a Smurf representing the function:

| $v_1$ | $v_3$ | $v_7$ | $v_9$ | $f$ |
|---|---|---|---|---|
| 0 | 0 | 0 | 0 | 0 |
| 1 | 0 | 0 | 0 | 0 |
| 0 | 1 | 0 | 0 | 0 |
| 1 | 1 | 0 | 0 | 1 |
| 0 | 0 | 1 | 0 | 0 |
| 1 | 0 | 1 | 0 | 0 |
| 0 | 1 | 1 | 0 | 1 |
| 1 | 1 | 1 | 0 | 0 |

| $v_1$ | $v_3$ | $v_7$ | $v_9$ | $f$ |
|---|---|---|---|---|
| 0 | 0 | 0 | 1 | 1 |
| 1 | 0 | 0 | 1 | 0 |
| 0 | 1 | 0 | 1 | 1 |
| 1 | 1 | 0 | 1 | 1 |
| 0 | 0 | 1 | 1 | 0 |
| 1 | 0 | 1 | 1 | 0 |
| 0 | 1 | 1 | 1 | 1 |
| 1 | 1 | 1 | 1 | 1 |

There is no edge from state 8 to state 1 because state 8 represents a linear subfunction. See below for details about linear subfunctions and how they are handled. Edges have two types of labels: in italic font are variable assignments (e.g. "*9* means $v_g$ is set to 0 and *9* means $v_g$ is set to 1); in bold are any inferences implied from the assignment (e.g. "1/"7/*9* means $v_1$ and $v_7$ are inferred to have value $0_1$ and $v_g$ is inferred to have value 1).

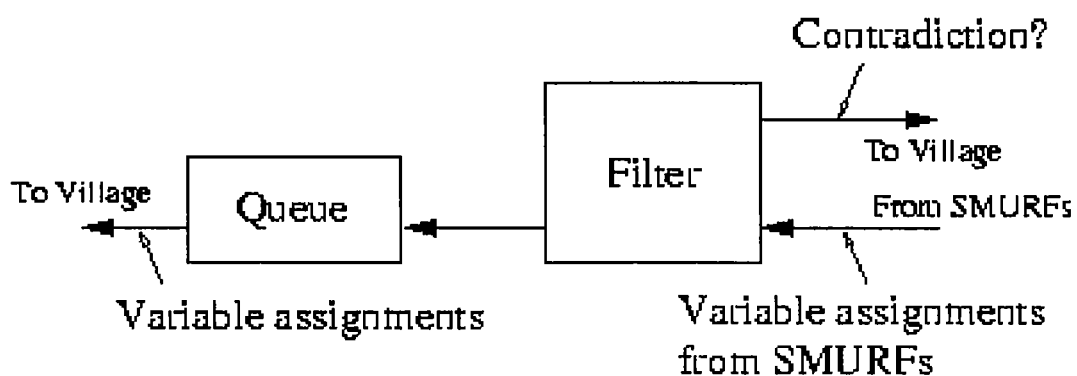

Figure 7: The Inference Queue

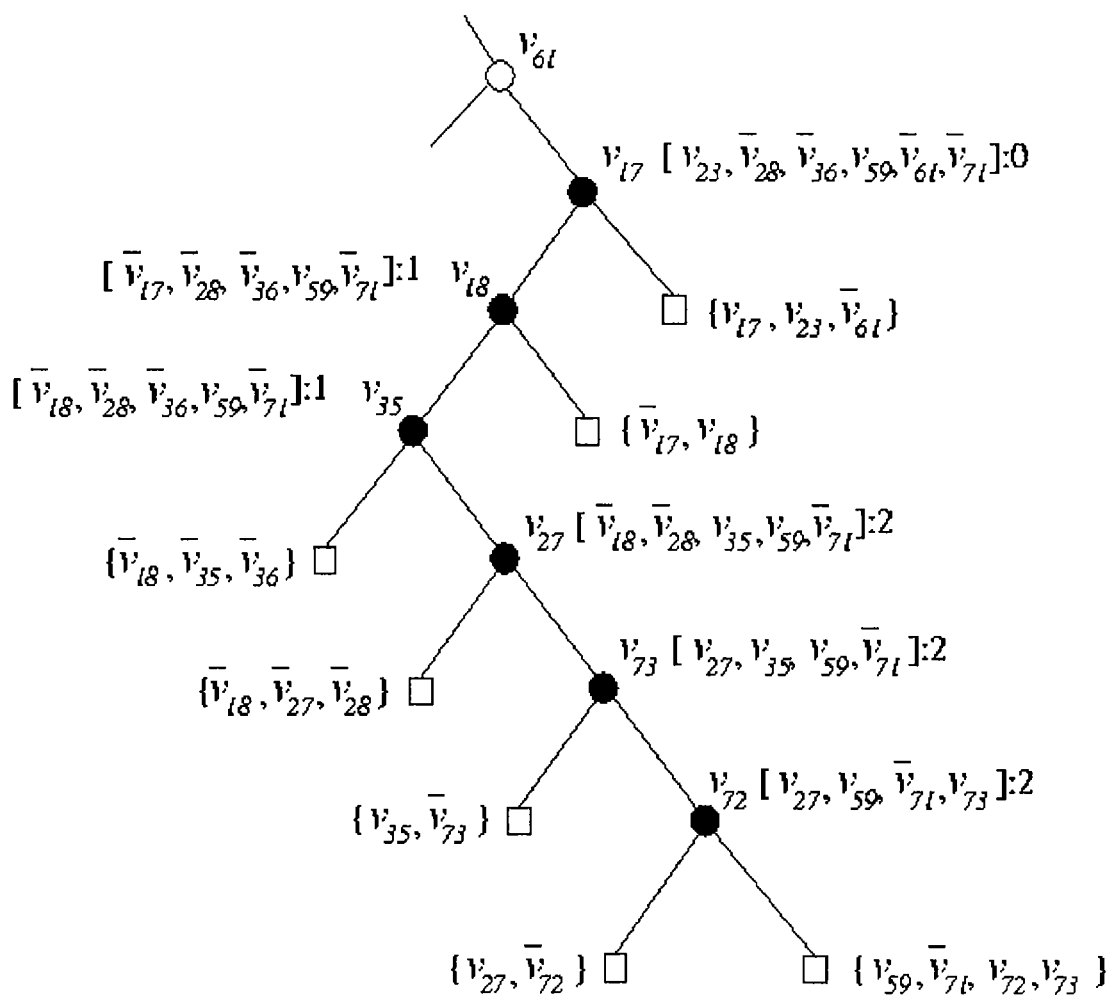
Figure 8: An Example of chaff lemmas

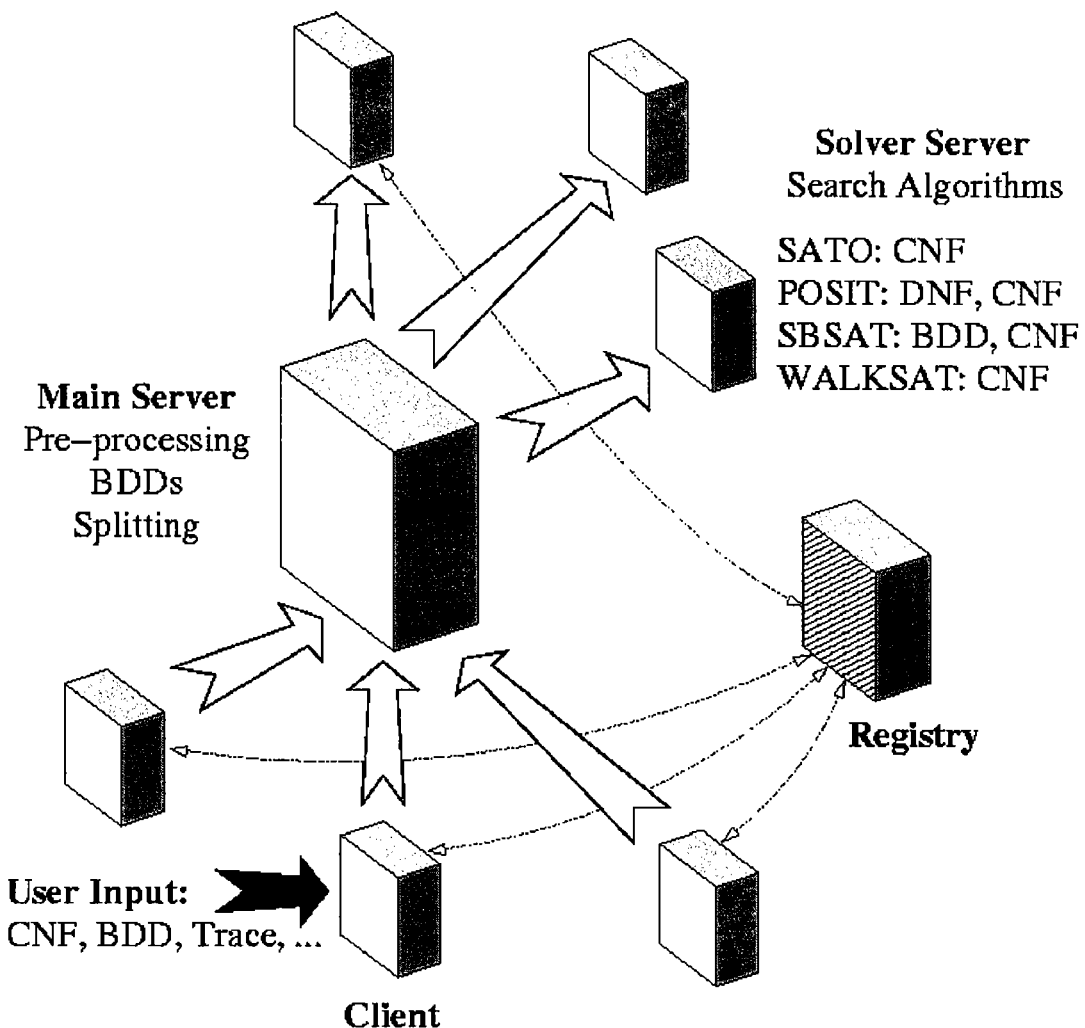
Figure 9: Block diagram showing the progression of a given formula from input through processing to brancher.

METHOD AND SYSTEM FOR NON-LINEAR STATE BASED SATISFIABILITY

PREAMBLE

This application is a continuation of U.S. patent application Ser. No. 10/164,203, Franco, et al., filed Jun. 6, 2002, now U.S. Pat. No. 6,912,700, which claims priority from provisional application Ser. No. 60/296,380, Franco, et al., filed Jun. 6, 2001, both of which are incorporated by reference in their entirety.

FIELD OF INVENTION

The present invention relates generally to a computerized system for the design and testing of integrated circuits, other complex devices and systems, the evaluation of software systems, solving non-linear systems of Boolean equations, and more particularly to computer program comprising instructions for implementing satisfiability algorithms involving such devices and systems.

BACKGROUND

In math and physics, "linear" means "simple" and "non-linear" means "complicated". The theory for solving linear equations is very well developed because it is simple enough to solve and only one solution exists. Non-linear equations can in general not be solved exactly (they have multiple solutions) and are the subject of much on-going research. Here is a brief description of how to distinguish a linear equation from a non-linear equation: In a linear equation, the variables (and their derivatives) must always appear as a simple first power. Here are some simple examples to illustrate this principle:

x+5=10 is linear and the equation is satisfied if and only if x takes the value 5. On the other hand, $5+x^2$32 6 is non-linear because $x^2$ is not a first power. The solution to this equation entails two values for x, namely −1 and +1 and this solution is harder to find than in the previous case.

In Boolean logic, equations have an analogous meaning but the operations of or (denoted $\vee$) and and (denoted $\wedge$) replace the operations of plus (denoted +) and times (denoted ×), the connective ≡replaces the connective =, and Boolean variables can only take two values, namely true (also referred to as value 1) and false (also referred to as value 0), instead of any number as in the case of mathematics and physics. Analogously, non-linear Boolean equations are far harder to solve than linear Boolean equations and often, if there is one solution, there are many solutions.

There are two current competing methods for solving systems of non-linear Boolean equations. The first is via the use of Binary Decision Diagrams (BDDs). The second, is via Conjunctive Normal Form (CNF) Satisfiability checkers, e.g., POSIT, GRASP, zCHAFF, SATO, WALKSAT, etc. A BDD is intended as a compact representation of a Boolean function. A Boolean function has several input variables and one output variable. Every input variable may either be independently assigned value 0 or 1 or may be left unassigned. The output takes either value 0 or 1 or has undetermined value depending on the values assigned to the input variables. The input assignment patterns causing the output to have value 0 or 1 or undetermined may be listed in a table called a truth table. A truth table corresponds uniquely to a particular Boolean function.

A BDD is a mathematical abstraction which describes a truth table in an alternative and compact form. A BDD consists of a number of nodes, one distinguished as the root, one as the 0 node and one as the 1 node, representing function variable values, and arcs leading away from nodes, except the 0 and 1 nodes, representing values given to input variables. In this formalism 0 represents false and 1 represents true. The 0 and 1 nodes together represent the 0 and 1 values, respectively, which the function may take. A path from root to the 1 node signifies an assignment of values to input variables which causes the function's output variable to have value true and a path to the 0 node signifies an assignment causing an output value of false. Principal attributes of BDDs leading to their wide use are: 1) a BDD can be a compact, efficiently computed representation for a Boolean function and 2) operations for combining BDDs, such as conjunction (the $\vee$operator), can be fairly efficient provided the number nodes in the resulting BDD is not great.

BDDs are typically applied to non-linear equations as follows. A non-linear equation is a Boolean function. Variables named in a non-linear equation are its input variables. Thus, each equation may be represented by a BDD. Solving a system of non-linear equations means finding an assignment of values to all variables named in the system which causes each equation to have value 1. An equation, which has value 1, due to an assignment, is satisfied by that assignment. Since a system of non-linear equations is a Boolean function, a system may be solved if its corresponding BDD can be computed. Starting from the easily computed BDDs for each equation and using the rich set of operations available to BDDs, a BDD solver combines BDDs until one is left: that which represents the entire system. If that point can be reached, the system is solved. Observe that purely BDD techniques involve no guessing and checking of assignments.

By contrast, Satisfiability checkers, or SAT solvers, solve a restricted class of non-linear Boolean equations referred to as CNF formulas (see below for a description) by guessing, checking, discarding, and guessing again input variable values until either all possible combinations are exhausted or until an assignment is found which satisfies all equations. A SAT solver starts with all variables unassigned and attempts to extend the set of currently assigned input variables, one at a time, until it can be determined that all equations are satisfied or that all possible assignments to remaining unassigned variables will not satisfy all equations. In the former case a satisfying solution to the system is found. In the latter case one or more of the last variables to be assigned are reassigned or unassigned and the search for satisfying extensions is continued. If all possible extensions from the starting case, where all variables are unassigned, fail to satisfy all equations then the SAT solver reports no satisfying solution is possible.

BDD solvers are limited in the size of problems that they can solve, e.g., hundreds of variables and thousands of equations, depending on the problem domain. The principle problem plaguing BDD solvers is that as BDDs are being combined, they can get extremely large before completion, even if the final BDD is very small.

SAT solvers can solve problems with tens of thousands of variables and hundreds of thousands of equations, depending again on the problem domain. However, good performance seems to depend heavily on search heuristics, which choose the order in which variables are assigned values. Heuristics pertain to a trial-and-error method of problem solving used when an algorithmic approach is impractical. But the management of highly intelligent heuristics requires a great deal of overhead using conventional data structures and high overhead cancels the potential gains offered by such heuristics.

BDD and SAT solvers have (separately) been applied to a variety of problems. Many of these are a subclass of a general class of expressions called Layered Boolean Formulas (LBF).

A formula is one of the LBF class of expressions if it is given as 1) a list $F=\{f_1, f_2, \ldots, f_m\}$ of m Boolean functions whose inputs are taken from a set $V=\{v_1, v_2, \ldots, v_n\}$ of n Boolean variables; and 2) a list $O=<o_1, o_2, \ldots, o_m>$ of m Boolean values, one for each function, which specify the values the functions' outputs need to have if the expression is considered satisfied. The problem that needs to be solved, given an LBF Ø, is to determine whether there exists a list of Boolean values $<b_1, b_2, \ldots, b_n>$ which the variables of V can be set to (that is, variable $v_i$ takes value $b_i$ for all $1 \leq i \leq n$) to satisfy the expression Ø (that is, makes all function outputs of F consistent with O) and if such a list exists (called a solution) output one.

The LBF class of expressions includes Conjunctive Normal Form (CNF) formulas, some Quantified Boolean Formulas (QBF), and Trace formulas. In a CNF formula each Boolean function $f_i$ is a conjunction of Boolean variables and complemented Boolean variables (a complemented Boolean variable just has a value opposite that of its variable counterpart) and each $o_i$ is 1. For example, $f_1$ might be expressed as $v_1 \vee \neg v_3 \vee v_8$ which is a conjunction of two variables and one complemented variable ($\neg v_3$) and has value 0 if $v_1$ and $v_8$ have value 0 and $v_3$ has value 1; has value 1 if $v_1$ or $v_8$ have value 1 or $v_3$ has value 0; and has undetermined value otherwise. Boolean functions in a Trace formula typically use the equivalence operator ≡ and a few other operators such as ite which means if-then-else. For example, $f_1$ of a Trace formula might be expressed as $$v \equiv ite(v_1, v_2, v_3);$$

This function has value 0 if either
1) $v_1$ and $v_3$ have value 0 and v has value 1; or
2) $v_1$ and v have value 0 and $v_3$ has value 1; or
3) $v_1$ and $v_2$ have value 1 and v has value 0; or
4) $v_1$ and v have value 1 and $v_2$ has value 0.

It has value 1 if either
1) $v_1$ and $v_3$ have value 0 and v has value 0; or
2) $v_1$ has value 0 and $v_3$ and v have value 1; or
3) $v_1$ and $v_2$ have value 1 and v has value 1; or
4) $v_1$ has value 1 and $v_2$ and v have value 0.

It has undetermined value otherwise.

A QBF expression is more complicated. Instead of asking whether there exists a list of Boolean values that satisfy Ø, the problem is to ask whether, for every possible combination of values that some of the V variables can have, there exists some combination of values that the remaining V variables can have with the result that Ø is satisfied, and if so, what is one such combination of values.

Before the 1990s, Binary Decision Diagrams (or BDDs) were considered the best way to deal with LBFs arising from practical problems. Unfortunately, on real LBFs, the number of nodes of "intermediate" BDDs (those that are formed while combining BDDs) can get to be enormous before realizing the final BDD which solves the problem and which can be quite small.

An alternative is to convert the BDDs to a conjunction of clauses, that is expressions of the form $\neg s_1 \vee \neg s_2 \vee s_3$, and solve the conjunction of all conjunctions of clauses using a SAT solver. Before the 1990s this was infeasible because SAT solvers performed a form of tree search, that is SAT solvers did not effectively remember and reuse what had been learned in early parts of the search process. This sharply contrasts with BDDs which reuse portions of paths leading to the 1 node and 0 node, respectively. But the 1990s saw major improvements in the design of SAT solvers including conflict resolution, a form of remembering learned facts which we call lemmas, lookahead for inferences, better search heuristics, and exploitation of problem symmetry to prune away large portions of the search space. With these improvements SAT solvers can now compete with and in some cases significantly exceed the performance of BDD tools.

Formulas such as these arise in a variety of formal verification problems including microprocessor verification, illegal transition checking, and interconnect synthesis, among others. Consider microprocessor verification first. A circuit for use in a computer or other electronic device is designed from a formal specification of its functionality. This specification is written in some human understandable form such as make a noise at noon on cloudy days only. But an implementation of this statement as a circuit must be in a machine understandable form involving input and output variables. For example, let time represent time-of-day, let weather represent a type of weather condition, let noise represent whether a noise is made. Then the circuit to build may be expressed $$\text{noise} \equiv (\text{time}=12:00) \wedge (\text{weather}=\text{cloudy}).$$

The output of this circuit has either logic value true or false depending on the values of its input variables, namely noise, time, and weather. For example, if input values are sunny for weather, 12:00 for time, and true for noise, then the circuit outputs false. Observe that a formal specification may also have a logic value of true or false depending on some conditions. For example, the specification above has value false if a noise is made on a sunny day. If a circuit is to function as expected, its output logic values must be consistent with the logic values of the associated specification for corresponding input variable/specification conditions, that is, the specification and the circuit design should be functionally equivalent.

The microprocessor verification problem is to prove, using a computer program, that a given formal specification is logically equivalent to a given circuit expression. This is accomplished by using a special language for writing specifications which can efficiently be transformed into a conjunction of logic expressions. To determine whether the conjunction of expressions, S, is functionally equivalent to a circuit design, D, the expressions representing D and S are combined as follows:

$$(D \wedge \neg S) \vee (\neg D \wedge S)$$

This equivalence expression always has value false if and only if D and S are functionally equivalent.

A SAT solver (computer program) checks all possible combinations of input values to see whether a given equivalence expression always has value false. But all SAT solvers operate on CNF formulas. Thus, equivalence expressions must be translated to CNF before being solved by a SAT solver. Translation has two undesirable side-effects: 1) the length of the equivalence expression in CNF may be much greater; 2) variables which are understood in the context of the equivalence expression may lose that property as they become scattered in the translation. Continuing with the above example, consider attempting to show that $$\text{noise} \equiv (\text{time}=12:00) \wedge (\text{weather}=\text{cloudy})$$

is equivalent to noise=ite(weather=cloudy, time=12:00,
    weather=cloudy)

The later expression may have come from the special formal specification language. Current solvers cannot directly deal with the equivalence expression. Rather, a straightforward translation of the equivalence expression to CNF might give (noise ∨(time=12:00)∨(weather=cloudy))∧(noise
    ∨(time=12:00)∨¬(weather=cloudy))∧(noise
    ∨¬(time =12:00)∨(weather=cloudy))∧(noise
    ∨¬(time=12:00)∨¬(weather=cloudy))∧
    (¬noise ∨(time=12:00)∨(weather=cloudy))∧
    (¬noise ∨(time=12:00)∨¬(weather=cloudy))
    ∧(¬ noise ∨¬(time=12:00)
    ∨(weather=cloudy))∧
    (¬ noise ∨¬(time=12:00)
    ∨∧(weather=cloudy))

A SAT solver will take this expression as input and attempt to solve it by searching for a solution. Although this example omits some trivial simplifications that could result in a reduced translated expression (and that most SAT solvers perform), it illustrates that the approach used by SAT solvers when inputs are extremely large results in a complexity of the translated expression that is much greater than the original expression, variables tend to get scattered throughout the translated expression, and the relationship between variables becomes blurred.

SUMMARY OF THE INVENTION

In one embodiment the invention comprises a computerized method for solving a non-linear Boolean equations comprising partially solving said non-linear Boolean equation; storing at least one precomputed search inference relating to said Boolean equation in at least one state machine; accessing said at least one search inference from said state machine to develop at least one heuristic for solving said non-linear Boolean equation; and determining if said Boolean equation is satisfiable using said at least one heuristic.

In another embodiment, said non-linear Boolean equation is translated into a set of functions and wherein said functions are represented in a Binary Decision Diagram and further wherein said partial solving step comprises solving each function in said set of functions for all possible inputs.

In another embodiment, said method includes computing a score for each of said at least one inference wherein said score is stored and associated with said at least one inference and wherein said score indicates the desirability of using said associated inference in said determining step.

In another embodiment, a set of heuristics is developed from said at least one inference in an order according to said score associated with said at least one inference.

In another embodiment, said state machine comprises at least one inference for a user domain relating to said non-linear Boolean equation.

In another embodiment, said state machine further comprises a computer readable data storage location for storing any linear inferences developed in said partial solving step.

In another embodiment, said state machine utilizes a technique selected from the group of autarkies, lemmas, and/or pruning to reduce a set of inferences associated with a user domain associated with said non-linear Boolean function.

In another embodiment the invention comprises a computerized method for verifying that a circuit expression for a microprocessor matches a specification associated with said microprocessor comprising transforming said specification into a conjunction of logical expressions; combining said conjunction with said circuit expression to produce a verification equation; analyzing said verification equation via a Binary Decision Diagram; partitioning said verification equation into a set of functions representing said verification equation; processing each function in said set of functions for all possible inputs; storing at least one inference developed from said processing step in a state machine; iteratively searching for a solution to said equation by utilizing at least one heuristic developed from said at least one inference stored in said state machine.

In another embodiment, said searching step does not comprise translating said equation into Conjunctive Normal Format.

In another embodiment, said invention comprises a computer system for solving a non-linear Boolean equations comprising a pre-processor, a state machine and a search engine wherein said pre-processor is configured to perform the steps of translating said Boolean equation into a set of functions; solving said set of functions for all possible inputs; said state machine is configured to store a set of at least one inferences developed from said solving step wherein said inferences are associated with a respective function in said set of functions; a search engine configured to search for a solution to said Boolean equation using a set of heuristics developed from said set of inferences.

BRIEF DESCRIPTION OF THE DRAWINGS

While the invention is claimed in the concluding portions hereof, preferred embodiments are provided in the accompanying detailed description which may be best understood in conjunction with the accompanying diagrams where:

FIG. 1 shows an example of an interconnect synthesis problem.

FIG. 2 shows sample modules and interconnect fabric for example of FIG. 1.

FIG. 3 shows a layered Boolean function corresponding to the example of FIG. 2.

FIG. 4 shows the effect of variable order on branch pruning applied to two functions.

FIG. 5 shows the result of strengthening applied to the two functions of FIG. 4.

FIG. 6 shows an example of a State Machine Used to Represent Functions (SMURF).

FIG. 7 shows an inference queue, which helps manage a collection of SMURFs.

FIG. 8 shows an example of Chaff lemma management and discovery.

FIG. 9 shows a block diagram of computational components of one embodiment of the system.

DETAILED DESCRIPTION OF THE EMBODIMENTS

The present invention is a method of solving a system of generalized non-linear Boolean equations called Satisfiability, or proving that no solution exists called Unsatisfiability. This method does not require the translation of the system of equations into CNF as the CNF SAT solvers do, nor does this tool solve for all inputs as BDD solvers do.

The SBSAT method may use a BDD front end to preprocess the input. The SBSAT method searches for a solution to the system of equations in the user domain, that is, directly using the original equations to determine which variable should be assigned a value next. This is accomplished by building a state machine to represent each of the user domain equations.

A state machine is a computerized device for storing the current status of the search process so that variable assignment decisions can be made efficiently by table lookup and not by recomputing complex calculations. The concept of the state machine construction is to pre-compute anything that can be pre-computed so that search time computations can be minimized. In one embodiment of the invention, the use of state machines support the precomputing and storing of all possible search futures (or other important information/inferences) before searching commences. In another embodiment, the method performs no computation while searching that is not absolutely required.

A state of an SBSAT state machine may capture information about all of the variables present in that particular state. It may further associate with each state a pre-computed score that is computed hierarchically at state machine build time. The score may be used at run time to determine what the next variable to assign a value to should be. This method of score pre-computation allows complex scoring functions to be computed that, in CNF branching, are too expensive to compute.

In another embodiment, each state reports any linear inferences, i.e., inferences of the form v=false, v=true, v=w, v=¬w, where v and w are input variables, that are implied by the current state. The search mechanism may use these inferences at run time. Thus, the state machines may support highly intelligent search heuristics. The state machines may contain information that is discovered once (expensively) at preprocessing time and reused (inexpensively) repeatedly during search.

At any point in the search process each state machine is in a particular state, called a current state, and access to any information contained in that state is immediate. When another variable is assigned a value or when a variable must be unassigned the current state becomes one of the other states of the state machine. In that case we say there has been a state transition from one state to another. State transitions may be predicted efficiently in preprocessing and may also carry information that may be used efficiently many times during search. For example, inferences that become valid after the transition may be saved. State machines also allow variables that exist only in that one state machine to be existentially quantified away. They allow complex autarky variable subassignments to be captured and globally applied. An autarky variable assignment or autarky is an assignment of values to some of the input variables such that a solution to any one extension of that assignment implies a solution to all other extensions and no solution to any extension implies no other extensions will lead to a solution. Identifying autarkies can be important during search because failure to extend a partial assignment containing an autarky means the same failure will result for any extension of that assignment so they should not even be tried. Thus, search time may be reduced considerably by identifying autarky subassignments.

An embodiment of a State Based Satisfiability Solver (SBSAT) solves problems in the user domain through techniques such as existential quantification, generalized cofactoring, branch pruning, lemmas, high order scoring functions, pure literals, and branch time autarky detection. The improved performance of various embodiments of the current invention is needed because many instances of problems are still too difficult to be solved by any existing method including pure BDD and pure SAT solvers. Furthermore, the magnitude of such problems is increasing as the need for more complex and compact circuits continues to grow.

The invention may solve instances of LBF (Layered Boolean Formulas) including Conjunctive Normal Form (CNF) formulas, some Quantified Boolean Formulas (QBF), and Trace formulas which may arise in a variety of formal verification problems including microprocessor verification, illegal transition checking, and interconnect synthesis, among others.

An embodiment of the invention solves LBFs by using BDD technology as far as is possible and then switching to search technology to complete a solution. Such an embodiment precomputes everything for the sake of efficient, advanced search heuristics by doing a function-complete lookahead for inferences while staying in the user domain. A preferred embodiment of the system and method does not include translation of the problem into CNF format. Thus, some domain-specific information that may be garbled by translation remains clear and accessible. For instance, dependent and independent variables, which have been known for some time to have tremendous impact on the speed of solvability in microprocessors, may be more successfully identified. Traditional BDD also recognizes these variables by staying in the user domain but the BDDs often get too big when combining to practically solve problems.

In one embodiment, the purpose of the pre-processing phase is merely to reorganize and reduce input functions, to discover some basic inferences, and to pre-compute information to be memoized, or saved, and used effectively by the search engine, called the brancher. All pre-computed information is saved. This is done using a collection of state machines, one for each function remaining after pre-processing. The state machines enable a new form of search look-ahead: inferences and other information resulting from any possible future computation from the current search state are immediately available for each pre-computed function. This differs from the partial breadth-first look-ahead of Stalmarck across all functions and the partial depth-first look-ahead, commonly called restarts, or Chaff.

Preferred embodiments of the invention support complete lookaheads on all possible search futures for all equations. Prior art embodies 1) partial breadth-first lookahead—where inferences are generated just a few levels below the current level (like looking ahead two or so moves in chess) and 2) partial depth-first lookahead—where inferences are generated during search then the search is restarted now knowing these newly generated inferences (like stoping the chess game after knowing what the opponent will do after several moves and restarting).

In various embodiments of the invention, function-complete lookahead admits search heuristics of greater complexity which can be computed efficiently. The net result is to reduce the size of the search space, due to the powerful heuristics, and increase the rate at which search steps are completed, due to the memorization of pre-computed information.

Existing search support strategies such as lemma maintenance and lemma replacement heuristics (see below) are incorporated by the invention. However some, particularly autarky variable subassignments are used in a unique way. The invention also incorporates existing and new BDD operations. Among the new ones are branch pruning and strengthening which are described below.

Pre-Processing.

In one embodiment, the preprocessor contains four principle components: primitive inferencer, branch pruner, strengthener, and existential quantifier.

The primitive inferencer also captures some inferences, namely v=true, v=false, v=w or v=¬w for some variables v and w, at pre-process time. These differ from those captured by branch pruning or other techniques in that they come from just one BDD.

The branch pruner eliminates redundancies but it also reveals inferences that may be used to simplify the input set of functions. However, not all inferences are revealed that can be as this outcome is sensitive to the order of variables used for the BDDs. This is illustrated in FIG. 4. The top two BDDs are branch pruned with no change. However, the same two functions under a different variable ordering, as shown by the bottom two BDDs, are branch pruned to reveal the inference $v_3$ is false.

The purpose of strengthening is to reveal the inferences not caught by branch pruning. It does so by existentially quantifying away variables in f that do not exist in c and then applying the branch pruner, leaving a reduced f which may reveal new inferences. FIG. 5 shows an example. The top two BDDs are strengthened and the resulting two BDDs are conjoined as shown in the bottom of the Figure to reveal $v_3$ is false.

Existential quantification is an existing concept among BDD tools: the idea is to eliminate a variable v from a function $f_i$ by substituting the logical or of $f_i$ with v set true and $f_i$ with v set false. This can have a major impact on function complexity if v is in only one of the input functions.

In another embodiment, the method for deriving a satisfying variable assignment for variables of a Boolean formula, compromises a iterative preprocessing phase which includes the steps of building clusters of equations that share common variables (if we view each equation as a Truth Table, this step causes as many zeros as possible to be entered into the Truth Table) and globally applying any inferences that were implied by the local equations (or clusters from above). The process of applying inferences may uncover additional inferences, these additional inferences are also applied globally until such time that no additional inferences are uncovered or the system of equations is solved or the system of equations is proven unsolvable. Variables that exist in only one equation are existentially quantified away (if additional inferences are uncovered return to the step of globally applying such inferences. Using a weakened form of generalized co-factoring, called branch pruning, conditional variable assignments from one equation (or cluster) are applied to other equations (or clusters). If additional inferences are uncovered return to return to the step of globally applying such inferences. A State Machine Used to Represent Functions (SMURF) is created for each equation (or cluster) out put from the pre-processing phase.

The data may be presented to the pre-processor via an input file. In this input file BDD variables may be created, all Boolean functions, e.g., AND, OR, NOT, IMPLIES, XOR, NOR, NAND, etc., may be used taking as inputs previously computed BDDs producing new BDDs as outputs. These BDDs created may be entered as macros. The macros may be passed parameters to create layered Boolean Functions. macros may be used to create additional macros. Once the user domain equation has been created, it is submitted as an input to the clustering method.

A sample input file is as follows:

```
P BDD 8 3 ;;; DIMACS Format, BDD representation, 8 variables,
3 user inputs
#define m1 (1 2 3 4) : and 1 or 2 xor 3 4      ;;; macro 1
#define m2 (1 2 3) : imp m1(1 3 2 T) xor 1 3;;; macro 2
and 6 xor 3 6                    ;;; equation 1
or eq(1) m2(6 3 8)               ;;; equation 2
*imp eq(2) eq(1)                 ;;; equation 3, User input 1
#define m3 (1 2 3 4 5) : or4 and 1 2 and 2 3 and 3 4 and 4 5 ;;; macro 3
*m3 (6 8 5 8 T)                  ;;; equation 4, User input 2
*m3 (m1(-2 3 4) m2(2 -3 -4) 2 4 3)   ;;; equation 5, User input 3
```

Input from the file continues until the specified number of user inputs has been processed. The user inputs are represented by * at the start of the current equation. Each entry, except macros, is entered as a new equation that can be either entered as a BDD equation awaiting further processing and/or as a user input. Equation entries, results of previous BDD calculations, or macros with parameter substitution, can be used to create new equations or macros. Macros are not entered in as user inputs nor are they entered as BDD equations. The BDD functions that are pre-defined are: AND, OR, NOT, IMP, XOR, EQU, NAND, NOR, NIMP, EXIST, UNIVERSAL, CoFactor, Prune, BDD_PRINT, and BDD_INF. Variables may be negated by use of NOT, or they be negated by simply negating the variable, e.g., 7, −7, 67, −67, NOT(7), NOT(67). Results of previous BDD calculations may be referenced in new equation or macro definitions by use of the EQ function with a parameter referencing the BDD equation as a parameter. This interface makes available to the user all the power and expressive power of BDDs. Computations can be carried out directly in the BDD tool if the equations being represented are simple enough. The BDD interface tool also supports BDD_PRINT, which prints out a BDD. BDD_INF, which computes all linear inferences that are represented by the BDD that was input as a parameter. BDD_INF returns all inferences of the form variable=0, variable=1, variable1=variable2, variable1=NOT(variable2) for any given BDD.

In addition to supporting DIMACS BDD input files, DIMACS CNF and DIMACS DNF files are also accepted as input. Also Carnegie Mellon Trace input files are also accepted as input files. All input file formats go through the BDD pre-processor. The BDD pre-processor, in all input formats, produces BDD equation outputs for the next step of the SATISFIABILITY solver.

In another embodiment the pre-processing phase may allow additional zeros to be entered into the truth table that represents each user level constraint. By adding extra zeros into each truth table then additional inferences will be exposed higher in the satisfiability branch tree. This results in backtrack with fewer assumptions. This results in solution times that are potentially orders of magnitudes more efficient.

In another embodiment the pre-processing phase avoids the building of unnecessary state machines. No state machine will have inferences at the top level. Every variable will occur in at least two state machines. All trivial systems of equations will have been solved before entering the brancher.

In another embodiment, the pre-processing phase removes all variables that do not exist in at least two equations. If a variable only occurs in one equation, then the satisfiability or non-satisfiability of the system of equations does not depend directly on that variable. If a satisfying assignment of variables is found, then substitution of the satisfying variable assignments into the original equation will yield the satisfying assignment of the variable that was existentially quantified away. If the system of equations was unsatisfiable after the variable was quantified away, then the system would also have been unsatisfiable with the variable that was existentially quantified away. Existentially quantifying away internal variables when using BDDs is a long established procedure for reducing the size and complexity of solving BDD problems. In this case we are using the technique during pre-processing to build optimal conditions for branching over generalized non-linear systems of equations.

In another embodiment the preprocessing phase seeks to remove as much dependency from the generalized systems of non-linear equations as possible. By making the system of equations independent as possible, then the scoring functions, which have an assumption of independence, will result in near optimal branching decisions. The following C code shows the branch prune algorithm. The highlighted code in the middle is what makes branch prune different from generalized co-factoring. The branch pruning algorithm makes conditional variable assignments.

```
BDDNode *prune(BDDNode *f, BDDNode *c) {
    // base case
    if(f == c) return true_ptr;
    if((c == true_ptr) || (f == true_ptr) || (f == false_ptr))
        return f;
    // Optional line if complemented edges are supported
    if(c == ite_not(f)) return false_ptr;
    // The following line is what makes prune different from GCF
    // i.e., variables in c not if f are existentially quantified
    if(f->variable > c->variable)
        // existentially quantify away c->variable
        return prune(f, ite_or(c->thenCase, c->elseCase));
    int v = f->variable;
    // process conditional variable assignment, v==true_ptr
    if(reduce_f(v, c) == false_ptr)
        return prune(reduce_t(v, f), reduce_t(v, c));
    // process conditional variable assignment, v=false_ptr
    if(reduce_t(v, c) == false_ptr)
        return prune(reduce_f(v, f), reduce_f(v, c));
    // recursive case, continue search for conditional assignments
    BDDNode *r = prune(reduce_t(v, f), reduce_t(v, c));
    BDDNode *e = prune(reduce_f(v, f), reduce_f(v, c));
    if(r == e) return r;
    return find_or_add_node(v, r, e);
}
```

In another embodiment, the preprocessing phase is essentially building a Directed Acyclic Graph (DAG) where at each node is represented every variable in the function that is represented by the current function. Stored within each node is a data structure for each variable in the current state. Stored with in each variable data structure is a pointer to a new state that would result from assigning the variable true within the current state, a pointer to a new state that would result from assigning the variable false within the current state, a pointer to a new state that would result if the current variable were to existentially quantified away, a pre-computed score under the assumption that the current variable is to assigned true, a pre-computed score under the assumption that the current variable is to assigned false, a pre-computed score for the variable as a whole. And associated with the current state is a score that is the merger of all of individual variable scores. In addition associated with each state is a list of pointers to descendant states that are autarky with the current state.

In another embodiment the preprocessing phase determines if a parent state and a descendant state are AUTARK or not is accomplished by existentially quantifying away the variables on the path that lead from the parent state to the descendant state, and then comparing the resulting function with the function associated with the descendant state. If the existentially quantified function equals the function that resulted from just following variable assignments, then the parent and descendant states are AUTARK with respect to one another. The AUTARKY in this case means that if the descendant state is satisfiable then the parent state will also be satisfiable, and that if the descendant state is unsatisfiable then the parent state will also be unsatisfiable. In particular, it means that the entire branching path reaching from the parent state to the descendent state can be thought of as a single assumption, even if multiple assumptions were involved in reaching the descendant state. However, in building the state machine we are only searching for AUTARKIES within each individual state machine. Before an AUTRAKY can be applied globally each state in some parent node of the brancher must be AUTRAK with respect to the current state of the brancher that is considering a back track decision. Global AUTARKIES are only searched for at brancher back track time. If an AUTRAKY is found then multiple assumptions get to be popped off the branching stack. The result of AUTARKY backtracking is that significant portions of the branching tree can be eliminated. Global AUTARKY backtracking can be efficiently implemented by storing pre-computed AUTARKY relationships in the state machines at state machine construction time.

In another embodiment, the preprocessing phase is used to build state machines that will include all of the information necessary to support high order scoring functions, fast state transitions, fast scoring function calculations, fast elimination of variables that exist only in one state machine, AUTARKY detection at branching back track time, early backtracking by branching on generalized non-linear equations directly, reduced number of backtracks, and more back jumping, all of which supports a faster satisfiability solver that is tailored to solving extremely complex systems of non-linear Boolean equations.

State Machines.

In various embodiments of the invention, the primary vehicle for revealing inferences during the search process is a collection of state machines, one for each function, called SMURFs (State Machine Used to Represent Functions). We illustrate the use of state machines with an example. Suppose one of the functions of a given LBF is $$v_3 \wedge ((v_1 \equiv \neg v_7) \vee v_9) \vee (\neg v_1 \wedge \neg v_7 \wedge v_9)$$

The truth table for this function is given in FIG. 6. Suppose also that we require this function to have output value true. Now suppose that during the search process, of the four variables input to the function, the first to be assigned a value is $v_1$ and suppose the value it is assigned is true. Then, for any extension to that assignment which does not involve the function's other input variables (namely $v_3$, $v_7$, and $v_9$), this function becomes the reduced function $$v_3 \wedge (\neg v_7 \vee v_9)$$

because the term $(\neg v_1 \wedge \neg v_7 \wedge v_9)$ can never be made true as long as $v_1$ is true. The original function is true if and only if the reduced function is true if $v_1$ is true. But for the reduced function to be true $v_3$ must be true. Thus the assignment of true to $v_3$ is forced and we say that $v_3$=true is an inference.

Inferences are extremely important to the search process: generally, the more variables which are forced the better because they relieve the brancher of the burden to test both values of those variables during search. If we knew all inferences that could be made for a given problem right from the start (that is, can do a complete lookahead for inferences), the problem would be solved without the need for any search at all. But the problem of finding all inferences is, not surprisingly, extremely hard. What state machines allow us to do is find all inferences for each of the original functions of a given problem (not the entire input) right at the start. In other words, state machines provide a complete lookahead on all functions. State machines do not supply as much information as a complete lookahead would but do provide some intermediate level of information that can make search much more intelligent: the inference information discovered per function at the start is compiled into and saved in the form of state machine and that information may be used efficiently (because it is computed only once during preprocessing) by a powerful search heuristic.

Prior attempts at using lookahead information involve either: 1) during search look ahead to the next one or two variable assignments and see what inferences will be made; and 2) continue the search for a while and accumulate inferences that are made, then save those inferences and restart the search process using the knowledge obtained from them. For these methods to use the same heuristics we do, the information we precomputed one time at the start will have to be recomputed over and over again. Below is an example of a heuristic that is easy for us to compute but difficult for other solvers.

Now we describe the structure of state machine. A state, for a given function, is an assignment of values from the set {false,true,unassigned} to its input variables. Transitions from one state to another occur deterministically when the value of an input variable changes. Each change in state asserts one or more new inferences, that is, propositions implied by the assignment of values corresponding to the target state, which did not hold before the transition. Since the assertion of an inference rules out a contrary transition, some states may be unreachable. Therefore, although a function of k variables has $3^k$ states, a SMURF typically consists of far fewer than this number since it does not maintain unreachable states.

Supervising the SMURFs is a module, called the Village, which creates them, performs the function of brancher (changes states when a variable is assigned a value), and collects inferences asserted by SMURFs so it can make early backtracking decisions and broadcast assertions to all SMURFs. Fundamental to the operation of the Village is an Inference Queue where all inferences are stored.

Each of a SMURF's states corresponds to a reduced Boolean function reached by forcing the function's input variables to the values specified by the state. A SMURF's initial state (state number 2) corresponds to the entire Boolean function, when all variables are unassigned. One of a SMURF's final states corresponds to a tautology (state number 1). A SMURF in state 1 means that its associated function is satisfied by the variable assignment of the current state. A SMURF's hypothetical trap state (state number 0) corresponds to a contradiction, meaning the current variable assignment cannot possibly extend to an assignment where the SMURF's associated function is satisfied. This state is unnecessary (see FIG. 6, for example) because precomputed inferences saved in association with state transitions force assignments to variables in such a way as to prevent a contradiction from actually being reached.

When a Boolean function evaluates to false its associated SMURF is built to represent the function's complement instead. A solution to the given collection of Boolean functions and output vector is a consistent total assignment (no unassigned variables) that drives each SMURF to its tautology state.

A SMURF may be modeled as a directed acyclic graph (DAG) where edges represent transitions and vertices represent states. Each edge in the DAG is labeled by a single variable assignment. When a SMURF receives a variable assignment from the Village, it changes state along the outgoing edge labeled by the assignment. Such an edge may exists because SMURFs may be built to report impending inconsistencies one step before they happen (see below for an explanation). Also associated with each edge may be a (possibly empty) list of other variable assignments that must be honored in order to validate the transition (one form of inference). The transitioning SMURF replies to the Village and gives it the assignments found in the list, called the SMURF's reply list. The Village enqueues them for broadcast to all Smurfs representing functions which depend on at least one of the inferred variables.

Each state has a unique reference number, and uniquely represents a partial assignment. In other words, there may exist in the DAG many paths from the initial state corresponding to one partial assignment (depending on the order in which the single assignments are presented), but all of these paths lead to the same state.

An important feature of SMURFs is that implementation of the trap state is avoided by making the tautology state reachable from all other states. This is a consequence of the reply inferences: when a SMURF would otherwise be a single variable assignment away from its trap state, it makes the opposite assignment as a reply inference, avoiding the problem. This is a generalization of the well-known unit clause rule used successfully in Davis-Putnam-Loveland-Logemann algorithms; it may force values on several variables at one time. This is illustrated in the example SMURF shown schematically in FIG. 6. If $v_3$ is assigned value false for some reason, the arc from state 2 to state 1 in the figure shows that variables $v_1$, $v_7$, and $v_9$ have implied values of false, false, and true, respectively, and these are placed in the reply list associated with that arc. Similarly, if $v_1$ is assigned the value true, then the assignment $v_3$=true is inferred from the reply list of the arc between states 2 and 4. Observe there is no arc from state 8 to state 1. This is because state 8 represents a linear function. The topic of linear functions is treated below where it should become clear why state 8 is terminal.

A SMURF listens to the Village for variable assignments. When a SMURF receives one, it makes the state transition and returns a list of inferences that must now hold. It is the responsibility of the Village to ensure that the inferences in the list become agreed upon by all Smurfs.

A Village manages a collection of Boolean functions and controls the search. It builds a SMURF for each function, has an inference queue to handle communication of variable assignments between SMURFs, and is a nearly complete brancher, lacking only heuristic guidance. The heuristic component of the solver, which guesses a variable assignment when no inferences are offered, is discussed below.

The inference queue contains an ordinary queue and a filter (refer to FIG. 7). The queue contains variable assignments. Every variable assignment made during the search is input into the inference queue. If the variable assignment was previously enqueued, the filter prevents it from being enqueued a second time. If the opposite assignment was previously enqueued, the filter reports a contradiction, causing a backtrack. To perform its task, the inference queue must remember every variable assignment that passes through it. Since these are the variable assignments assumed so far in the search, the memory of the filter is enough to determine a search state.

A Village has a state space in which each state corresponds to a particular partial assignment on the set of input variables. Unlike SMURF state spaces, this space is too large to explore completely; instead, it is the job of the Village brancher to find a state with a consistent total assignment. From a particular Village state, the brancher guesses a variable assignment by calling a heuristic function. If the new state cannot be extended to a solution, then the original state must be restored and the opposite of the guess assumed.

The following is a description of Village's brancher:

```
Repeat {
  Push the current Village state onto the stack.
  Consult a heuristic for a guess and push it onto the Inference Queue.
  While Inference Queue is not empty {
    Dequeue a variable assignment and broadcast it to dependent Smurfs.
    Enqueue all assignments returned by the Smurfs.
    If Inference Queue reports a contradiction:
      If Village Stack is empty, terminate in failure.
      Otherwise, pop the stack (restore the previous Village state)
        and enqueue an assignment opposite the assumption made
        at that state.
  }
  If all variables have been assigned, report a solution.
}
```

Observe the following about SMURFs:
1. A state of a single SMURF may be entered many times during a search even though all search states are entered at most once. Thus, precomputing state and transition information saves on overhead during the search.
2. The pre-computation of SMURF information may be amortised still further in the case that the LBF problem is modified to ask whether solutions exist for the same input formula but different output function values.
3. From any SMURF state, all computation futures are easily accessible.

Although SMURF size can grow exponentially in the number of input variables we have developed three ways to control size. First, there are some functions which have SMURFs that can be simulated by a few states and a counter. An example of such a function is $x \equiv a \lor b \lor \ldots \lor y$. Where possible, such simulations are used. Second, a function appearring many times with different inputs may be parameterized so that its SMURF may be constructed once and used many times. Third, if all else fails and a very large SMURF is unavoidable, the action of a SMURF may be simulated by a modified BDD which changes through the search to allow inferences to percolate to the top as would happen when entering a corresponding SMURF state.

Search Heuristics.

Complex search heuristics may be efficiently computed from pre-computed SMURF state and transition information. The objective of a search heuristic is to pick a variable for branching and then to pick the most likely branch to search first.

In one embodiment, FutureInference, each SMURF state has a precomputed weight to which every inference, that the SMURF may yet broadcast, contributes. The computation is done in a bottom-up fashion: a state's successors' contributions are computed before the state's own contribution. If a state s has p successors $\{s_1, s_2, \ldots, s_p\}$, then the weight of s is $$\sum_{i=1}^{p} (weightOf(s_i) + numberOfInferencesMadeEnrouteTo(s_i))/k*p$$

where k is some predetermined constant. The weight of the final (tautology) state is 0, as no inferences are ever reachable from it.

The constant k controls the balance between quantities of inference and how deep into the future they occur. The original FutureInference heuristic took k equal to 1 so that the score of a state was an arithmetic mean of its successors' scores plus the number of inferences replied in the transition. However, the latest FutureInference heuristic implemented uses a k of 3. It is clear that some problems are more successfully solved by a lower k and some by a higher k but values outside the range 1 to 3 have not shown any special solving power.

At a choice point each variable is assigned a score equal to the sum of the weights of the SMURFs that still use it in their current states. The variable with the highest score is then chosen for branching.

In a second embodiment a search heuristic called GloballyBalanced-LocallySkewed (GBLS) attempts both to skew the search within a SMURF toward forcing inferences as soon as possible and balance the expected global search space seen among all SMURFs. In GBLS the states of SMURFs are assigned weights in the manner of the FutureInference heuristic. In addition, every state transition gets a weight derived from the weight of the destination state and the number of reply inferences along the transition. The score of a literal is the sum of the weights of the outgoing transitions from current states on the literal. Each variable is scored as $(sv_1+1/4096)*(sv_0+1/4096)$, where $sv_0$ and $sv_1$ are the scores of its literals. The highest-scoring variable is chosen for branching, and the branching is in the direction of the higher-scoring literal.

Linear Functions.

A linear function either has value true if and only if an even number of its input variables have value true (even type), or has value true if and only if an odd number of its input variables have value true (odd type). Even if given functions are not linear, they may be reduced to linear subfunctions during the search for a solution, as variables are assigned values. During pre-processing, every linear subfunction of every function in F is tagged to an appropriate SMURF state. When that state is reached during search, the linear subfunction it tags is added to a collection of all currently active (that is, inferred) linear functions. For such a collection we can answer the following questions efficiently:
1. Are there any equivalences between variables?
2. Are any variables forced to a value?
3. Is the collection of functions satisfiable?

These are answered when the collection of linear functions changes by applying gaussian elimination. Gaussian elimination is a well-known technique for solving a system of linear equations. In this technique like terms of any pair of equations may be added together to form another equation which replaces one of the two that were added. The net effect of the addition is to replace an equation with one having one fewer term.

Lemmas.

As is the case with all modern SAT solvers, we reuse some of the refutations obtained for subsets of functions after guessing values for a substantial number of input variables. This has the effect of turning a tree search into a search on a DAG (edges directed downward) with the result that fewer nodes of the search space are expanded. A refutation which is saved for future use is a lemma. More precisely, a lemma is a minimal subset of variables and their values which actually causes a refutation at a particular node in the search DAG. There may be several such lemmas for each node of the search DAG but using all of them is too expensive. Thus, heuristics for choosing lemmas as well as replacing lemmas with more current ones have become extremely important and can have a tremendous effect on the number of nodes expanded in the search space. We use the heuristics developed by Chaff. FIG. 8 illustrates this. The white circle is a choice point involving variable $v_{61}$ at a depth 20 (according to the table) in the search DAG. The black circles are variable choices which are forced by functions, in this case simple disjunctions, shown beside white boxes. After setting $v_{61}$ to false, $v_{17}$ is forced to true, then $v_{18}$ to true, and so on until a contradiction is reached at $v_{72}$. At this point the brancher creates the resolvent of the two disjunctions below node $v_{72,s}$ shown as a disjunction between square brackets, and checks to see how many of its variables are below the $v_{61}$ choice point. In this case the number is 2. The brancher backtracks to $v_{73}$ and repeats until at node $v_{35}$ it finds the number to be 1. At this point the bracketed disjunction becomes a lemma and the search "backjumps" to the deepest node corresponding to a variable in the new lemma.

Applications

Our solver can deal directly with the equivalence expression. In this case it is ($\neg$ (noise≡(time=12:00) $\wedge$ (weather=cloudy))
  $\wedge$ (noise≡*ite*(weather=cloudy, time=12:00,
   weather=cloudy))) $\vee$ ((noise≡(time=12:00)
  $\wedge$ (weather=cloudy)) $\wedge$
   $\neg$(noise≡*ite*(weather=cloudy, time=12:00,
   weather=cloudy)))

which, because this is a very simple example, our solver immediately determines is unsatisfiable during pre-processing using typical BDD operations.

Subexpressions allowed by our solver, such as time=12:00 and weather=cloudy implies noise are typically more intuitive than their CNF counterparts such as time≠12:00 $\vee$ weather≠cloudy $\vee$ $\neg$noise and this allows our solver to use more intuitive and intelligent search heuristics to find a solution.

The above example as well as all short examples are too simple to appreciate the power of our solver. More typically, a specification of circuit behavior and an implementation are given to a solver as an LBF. If that LBF has no solution then the circuit and its specification match, otherwise there is a bug. LBFs of this kind may be given as several thousand equations similar to some or all of the following:

$v \equiv v_1 \wedge v_2 \wedge \ldots \wedge v_k;$ $v \equiv \neg v_1;$ $v \equiv ite(v_1, v_2, v_3);$ $v \equiv v_1 \vee v_2 \vee \ldots \vee v_k;$ where $v_i$ can be an independent or dependent variable.

As a second example consider the problem of interconnect synthesis which is illustrated and described in FIG. 1. This problem arises when configuring Field Programmable Gate Arrays to behave according to a given circuit specification. A conceptual circuit is partitioned into sections and the question is whether there are switch settings for a given interconnect fabric which allow the FPGAs to be connected in such a way as the circuit specification requires. If there is a set of switch settings that works, show that it is the only one that does.

An interconnect fabric, as shown in FIG. 2, may be expressed using the following Boolean terms: a term similar to (x=a) is a variable which is interpreted to be true if and only if input point a is connected to output point x; the operator $\wedge$ denotes Boolean and; the operator ≡ expresses equivalence between two Boolean variables; the operator $\vee$ is Boolean or; the operator ite(a,b,c) is the value of b if a has value true and is the value of c otherwise (ite stands for if-then-else). An LBF representing the solution to the example is shown in FIG. 3. The variables appearing in the last group of the figure are considered to be output variables. For a particular mapping, set the appropriate output variables to true (e.g. ($o_1=a_1$), ($o_2=a_3$), ($o_3=a_2$), and ($o_4=a_4$)), the remaining output variables to false, and solve for values of $s_i$. Doing so in this case gives $s_1$=false, $s_2$=false, and $s_3$=true. Add the expression $\neg s_1 \vee \neg s_2 \vee s_3$ to those of FIG. 3 and solve to determine uniqueness (unsatisfiability).

What makes this class of problems interesting is our solver can immediately infer a solution without any search whatsoever. Thus, a solution may be obtained in a very short time. This is typically not the case if BDD tools are used exclusively. The trick is to use a method which we have adapted from other branches of electrical engineering called the impulse method. In this method connections from input to output are forced one at a time. One may develop separate expressions for each forced connection and solve the whole system of expressions as one. Although the resulting expression is huge, variable assignments are forced and a solution is obtained in less than a second, after the input expression is formulated.

Finally, we discuss the illegal transition checking problem. Consider a system of some number of "chunks" of electronic circuits, the output lines of one chunk feeding into the input lines of another chunk, except that the input lines of one particular chunk are considered the inputs to the system and the output lines of one particular chunk are considered the output of the system, and suppose that each chunk has some "control" lines which switch data entering the chunk on its input lines to the chunk's output lines. Each chunk typically has some internal memory that is considered inaccesible to other chunks. Over time, possibly numerous times, the memory is given values by the internal circuitry of the chunk: those values depend on previous memory values and current input and control line values. In a secure system, some values for those memory elements will be restricted and therefore considered "illegal." The illegal transition checking problem is to determine whether some illegal memory values are possible given some sequence of system input assignments and control assignments. Our solver is well suited to this class of problems because each chunk is a circuit that is handled as a unit by our solver. A SAT solver must translate a chunk to CNF and therefore not necessaily preserve the strong interdependence of variables corresponding to a chunk and independence of elements in different chunks. Thus, our solver is able to use this interdependence/independence information intelligently.

FIG. 9 shows a block diagram of an embodiment of the system. Inputs are a conjunction of Boolean functions expressed in any common format such as CNF, BDD, or Trace and exist as a computer file of latin symbols and symbols representing logic connectives and parentheses. All inputs enter a pre-processor which converts all functions to BDD and then reduces and simplifies those BDD functions (that is, the number of variables and subexpressions is reduced, redundant portions of an input are eliminated, and functions remaining after pre-processing are made more independent of each other). Optionally, the pre-processor exists on a remote server and inputs may be transmitted over the internet to the server for pre-processing. The location of the server is obtained by means of an internet query to a Registry operating from a published port on a world-wide known computer which is connected to the internet. After pre-processing, the functions may be partitioned into separate components by the Splitter and each component (possibly there is just one component: namely the entire input) is then sent to a SAT solver, a device which searches for a solution. Many different solvers may be recipients of a component. All but SBSAT, which is part of this invention, require translation to CNF or DNF (Oust a complementary way to express CNF). Shown in FIG. 9 are other popular SAT solvers such as SATO, GRASP, and CHAFF but other solvers could just as easily connect to the splitter. The SAT solver works on the component that it receives and attempts to solve it. Progress is reported to SAT solvers working on other components (the splitter knows which these are) so that all SAT solvers can agree on values to input variables when a solution is reported by the splitter. When ready, the splitter reports the solution (or that none is possible) to the program that originated the request in the first place.

We claim:

1. A computerized method for solving a non-linear Boolean equation comprising:
   partially solving said non-linear Boolean equation;
   storing at least one precomputed search inference relating to said Boolean equation in at least one state machine;
   accessing said at least one search inference from said state machine to develop at least one heuristic for solving said non-linear Boolean equation;
   determining if said Boolean equation is satisfiable using said at least one heuristic;
   wherein said state machine includes at least one field programmable gate array.

2. A method as claimed in claim 1 wherein said non-linear Boolean equation is translated into a set of functions and wherein said functions are represented in a Binary Decision Diagram and further wherein said partial solving step comprises solving each function in said set of functions for all inputs.

3. A method as claimed in claim 1 further including the steps of computing a score for each of said at least one inference wherein said score is stored and associated with said at least one inference and wherein said score indicates the desirability of using said associated inference in said determining step.

4. A method as claimed in claim 3 wherein a set of heuristics is developed from said at least one inference in an order according to said score associated with said at least one inference.

5. A method as claimed in claim 1 wherein said state machine comprises at least one inference for a user domain relating to said non-linear Boolean equation.

6. A method as claimed in claim 5 wherein said state machine further comprises a computer readable data storage location for storing any linear inferences developed in said partial solving step.

7. A method as claimed in claim 1 wherein said state machine utilizes a technique selected from the group of autarkies, lemmas, and/or pruning to reduce a set of inferences associated with a user domain associated with said non-linear Boolean function.

8. A computer system for solving a non-linear Boolean equations comprising:
   a pre-processor, a state machine and a search engine wherein
   said pre-processor is configured to perform the steps of translating said Boolean equation into a set of functions;
   solving said set of functions for all inputs;
   said state machine includes at least one field programmable gate array and is configured to store a set of at least one inferences developed from said solving step wherein said inferences are associated with a respective function in said set of functions;
   said search engine configured to search for a solution to said Boolean equation using a set of heuristics developed from said set of inferences.

* * * * *